(12) United States Patent
Oshima et al.

(10) Patent No.: US 12,394,645 B2
(45) Date of Patent: Aug. 19, 2025

(54) SUBSTRATE PROCESSING SYSTEM AND METHOD OF TEACHING TRANSFER DEVICE

(71) Applicant: Tokyo Electron Limited, Tokyo (JP)

(72) Inventors: Tomoyuki Oshima, Tokyo (JP); Takehiro Shindo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 451 days.

(21) Appl. No.: 17/820,039

(22) Filed: Aug. 16, 2022

(65) Prior Publication Data

US 2023/0095452 A1   Mar. 30, 2023

(30) Foreign Application Priority Data

Sep. 29, 2021   (JP) ................. 2021-159748

(51) Int. Cl.
| | | |
|---|---|---|
| *H01L 21/67* | (2006.01) | |
| *B25J 9/16* | (2006.01) | |
| *C23C 14/56* | (2006.01) | |
| *H01L 21/677* | (2006.01) | |

(52) U.S. Cl.
CPC ...... *H01L 21/67201* (2013.01); *B25J 9/1692* (2013.01); *C23C 14/566* (2013.01); *H01L 21/67742* (2013.01)

(58) Field of Classification Search
CPC ......... H01L 21/67201; H01L 21/67742; H01L 21/67196; H01L 21/67259; H01L 21/68; H01L 21/67754; H01L 21/67167; H01L 21/6719; H01L 21/68771; B25J 9/1692; B25J 9/1664; B25J 11/0095; B25J 15/0014; C23C 14/566

See application file for complete search history.

(56) References Cited

U.S. PATENT DOCUMENTS

2020/0118851 A1*  4/2020 Goto .................. B65G 49/07

FOREIGN PATENT DOCUMENTS

| JP | 2020-061472 | 4/2020 |
|---|---|---|
| KR | 10-2020-0040682 | 4/2020 |

\* cited by examiner

*Primary Examiner* — Adam R Mott
*Assistant Examiner* — Matthew C Gammon
(74) *Attorney, Agent, or Firm* — IPUSA, PLLC

(57) ABSTRACT

A substrate processing system includes a load-lock module including load-lock module stages, a process module including process module stages, a vacuum transfer module that connects the load-lock module to the process module, a first transfer device that transfers substrates from the load-lock module stages to the process module stages, the first transfer device being provided in the vacuum transfer module, a second transfer device that transfers the substrates to the load-lock module stages, and a processor. The processor is configured to perform teaching a position at which the first transfer device receives the substrates from the load-lock module, teaching a position at which the first transfer device delivers the substrates to the process module, measuring shift amounts between the process module stages and the substrates mounted thereon, and correcting positions at which the second transfer device delivers the substrates to the load-lock module stages based on the measured shift amounts.

5 Claims, 7 Drawing Sheets

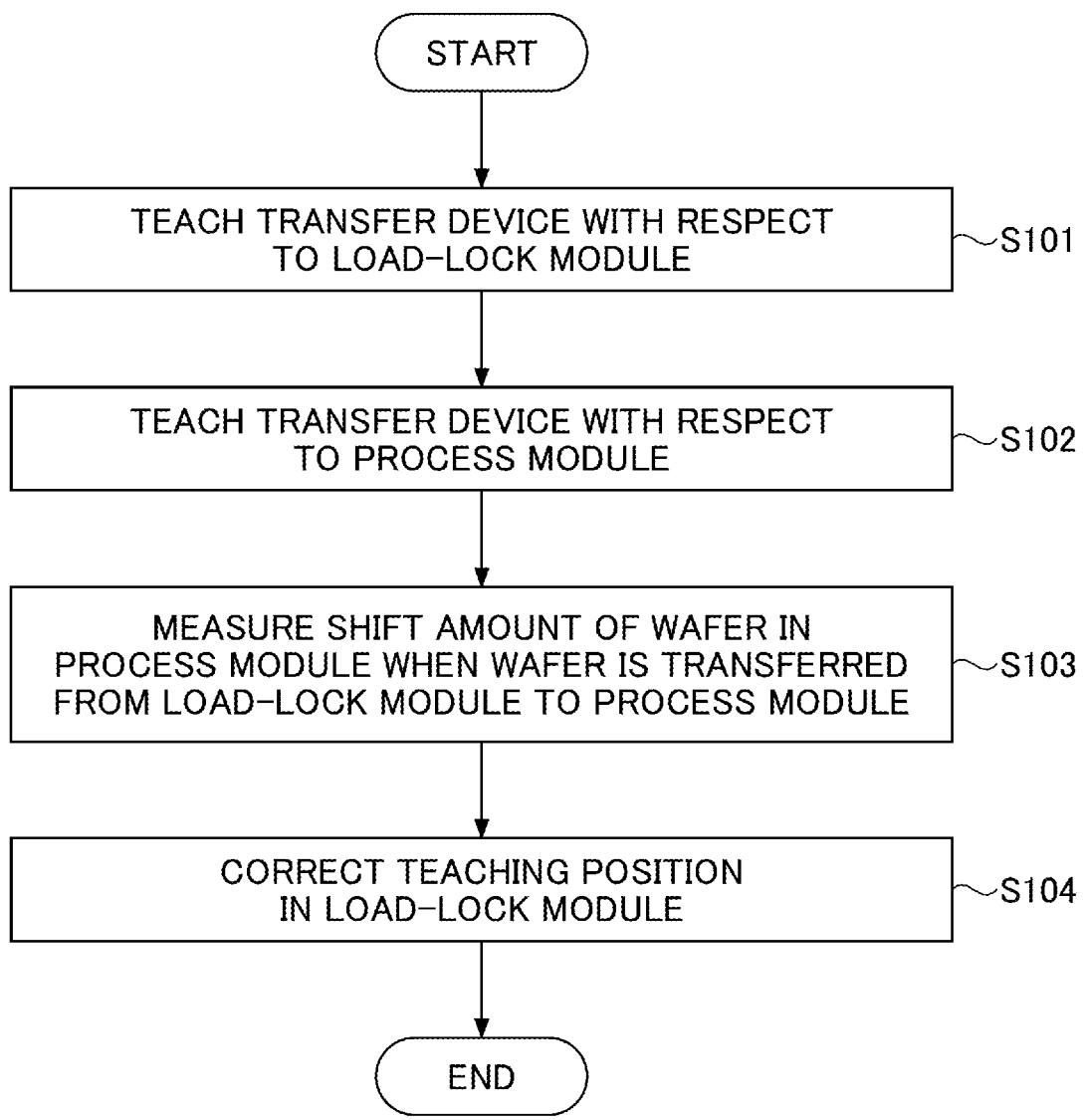

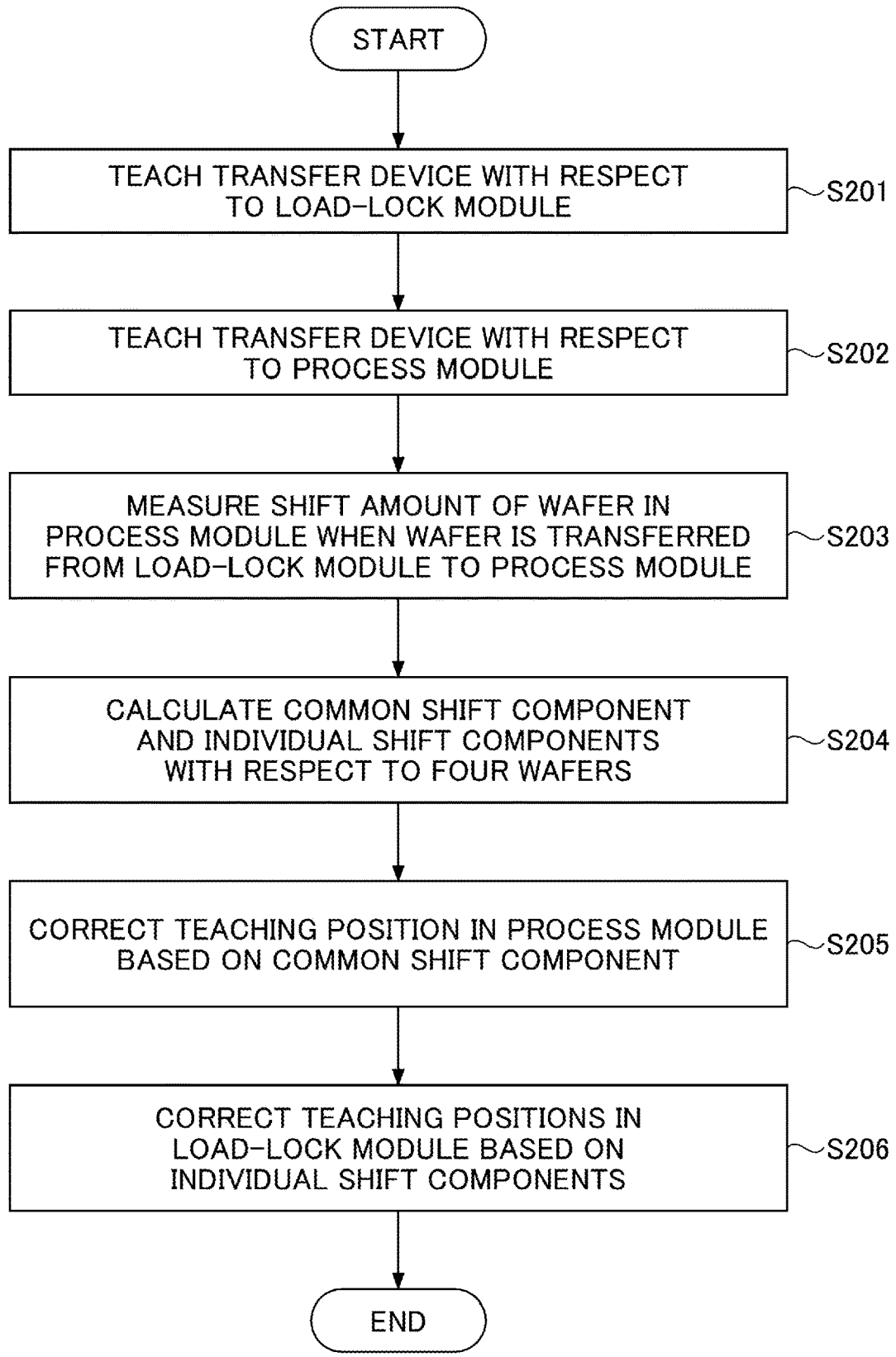

SUBSTRATE PROCESSING SYSTEM AND METHOD OF TEACHING TRANSFER DEVICE

CROSS-REFERENCE TO RELATED APPLICATIONS

This patent application is based on and claims priority to Japanese Patent Application No. 2021-159748 filed on Sep. 29, 2021, the entire contents of which are incorporated herein by reference.

TECHNICAL FIELD

The present disclosure relates to a substrate processing system and a method of teaching a transfer device.

BACKGROUND

Patent Document 1 discloses a substrate processing system including a load-lock module including multiple stages, a process chamber (a process module) including multiple stages, and a transfer device configured to transfer multiple substrates mounted on the stages of the load-lock module to the stages of the process module.

The position of the stage in the process module has individual error with respect to a design value. Additionally, the error differs for each process module.

One aspect of the present disclosure provides a substrate processing system that transfers a substrate in consideration of a shift of a stage and a method of teaching a transfer device.

RELATED ART DOCUMENT

[Patent Document]
[Patent Document 1] Japanese Laid-open Patent Application Publication No. 2020-61472

SUMMARY

A substrate processing system includes a load-lock module including a plurality of load-lock module stages, a process module including a plurality of process module stages, a vacuum transfer module that connects the load-lock module to the process module, a first transfer device configured to transfer a plurality of substrates from the plurality of load-lock module stages to the plurality of process module stages, the first transfer device being provided in the vacuum transfer module, a second transfer device configured to transfer the plurality of substrates to the plurality of load-lock module stages, and a processor. The processor is configured to perform teaching a position at which the first transfer device receives the plurality of substrates from the load-lock module, teaching a position at which the first transfer device delivers the plurality of substrates to the process module, measuring shift amounts between the plurality of process module stages and the plurality of substrates mounted thereon, and correcting positions at which the second transfer device delivers the plurality of substrates to the plurality of load-lock module stages based on the measured shift amounts.

BRIEF DESCRIPTION OF THE DRAWINGS

FIG. 5 is an example of a flowchart depicting a method of teaching a transfer device in a substrate processing system according to a first embodiment;

FIG. 6 is an example of a flowchart depicting a method of teaching a transfer device in a substrate processing system according to a second embodiment;

DETAILED DESCRIPTION OF EMBODIMENTS

Figure 1:
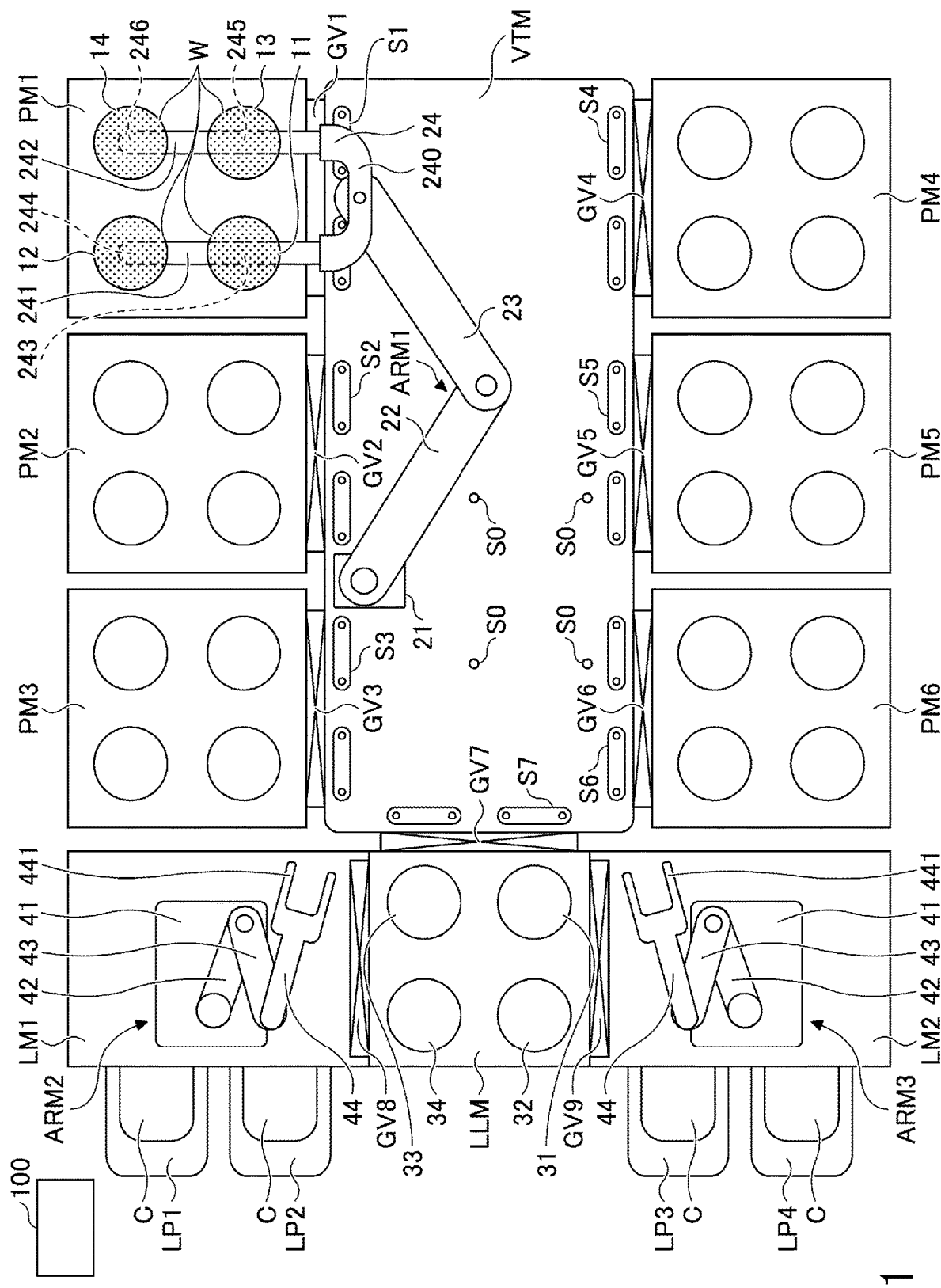
FIG. 1 is a plan view illustrating an example configuration of a substrate processing system according to an embodiment.

In the following, embodiments of the present disclosure will be described with reference to the drawings. In each drawing, the same components are indicated by the same reference numerals and overlapping descriptions may be omitted.

<Substrate Processing System>

Figure 2:
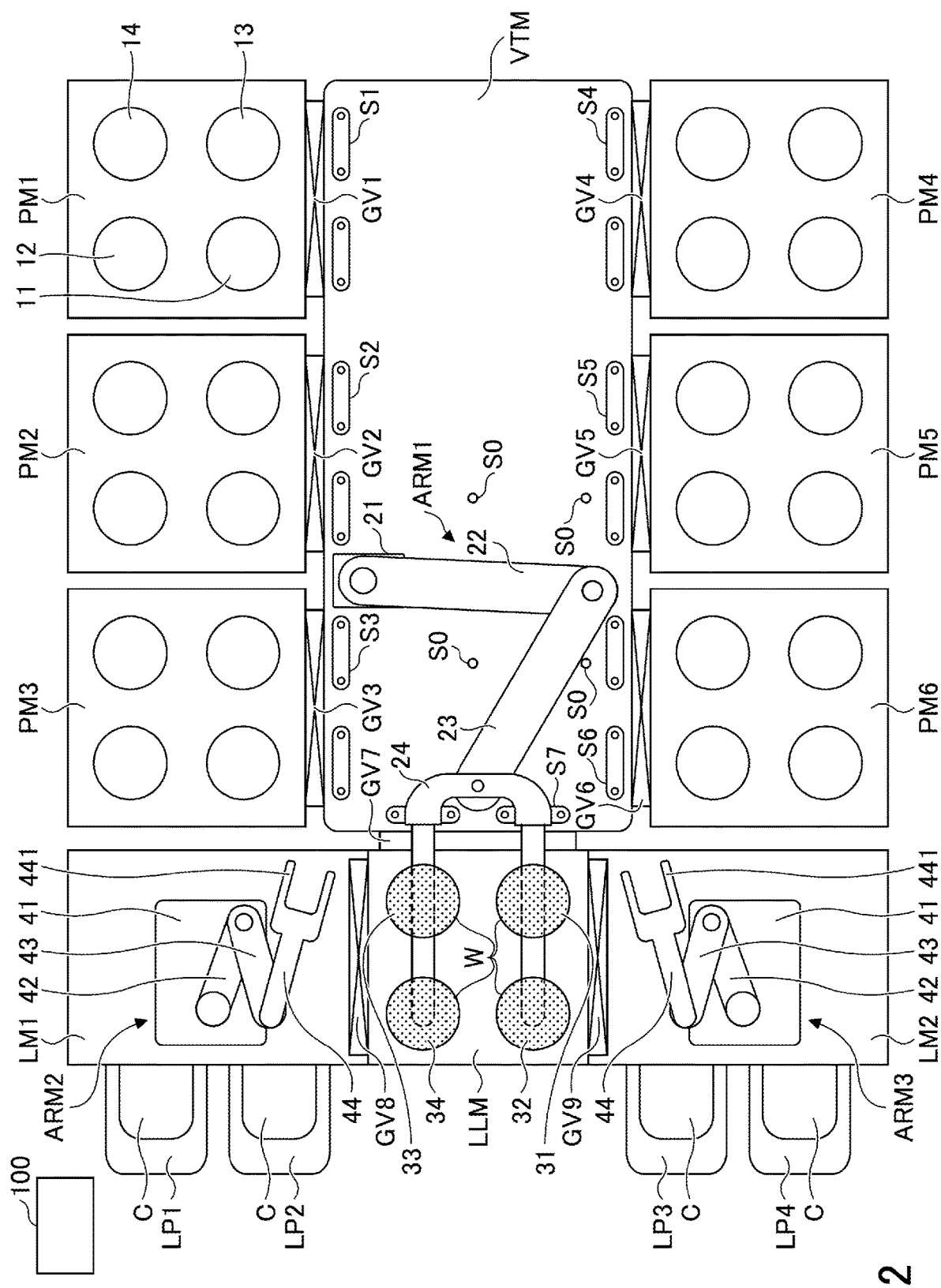
FIG. 2 is a plan view illustrating an example configuration of the substrate processing system according to the embodiment.

An example of an overall configuration of a substrate processing system according to the embodiment will be described with reference to FIG. 1 and FIG. 2. FIG. 1 and FIG. 2 are plan views each illustrating an example configuration of the substrate processing system according to the embodiment. FIG. 1 illustrates an example of a state in which a wafer W is transferred into a process module PM1. FIG. 2 illustrates an example of a state before the wafer W is transferred from a load-lock module LLM. The wafer W is illustrated with dot hatching.

The substrate processing system illustrated in FIG. 1 is a cluster structure (multi-module type) system. The substrate processing system includes process modules PM1 to PM6, a transfer module VTM (a vacuum transfer module), a load-lock module LLM, loader modules LM1 to LM2, load ports LP1 to LP4, and a controller 100.

The process modules PM1 to PM6 are depressurized to a predetermined vacuum atmosphere, and a desired process (an etching process, a deposition process, a cleaning process, an asking process, and the like) is performed on the semiconductor wafer W (hereinafter referred to as the "wafer W") inside the process modules. The process modules PM1 to PM6 are disposed adjacent to the transfer module VTM. The process modules PM1 to PM6 and the transfer module VTM communicate by opening and closing gate valves GV1 to GV6. The process module PM1 includes stages 11 to 14 where a total of four wafers W are mounted in a 2×2 matrix shape in plan view. Similarly, the process modules PM2 to PM6 each include stages where four wafers W are mounted. Here, the operation of each section for processing in the process modules PM1 to PM6 is controlled by the controller 100.

The transfer module VTM is depressurized to a predetermined vacuum atmosphere. Additionally, a transfer device ARM1 that transfers the wafer W is provided inside the transfer module VTM. The transfer device ARM1 carries in and carries out the wafer W between the process modules PM1 to PM6 and the transfer module VTM in accordance with the opening and closing of the gate valves GV1 to 6.

The transfer device ARM1 carries in and carries out the wafers W between the load-lock module LLM and the transfer module VTM in accordance with the opening and closing of the gate valve GV7. The operation of the transfer device ARM1 and the opening and closing of the gate valves GV1 to GV7 are controlled by the controller 100.

The transfer device ARM1 is configured as a multi-joint arm including a base 21, a first link 22, a second link 23, and an end effector 24. One end of the first link 22 is rotatably attached to the base 21 such that the rotational axis is the up and down direction. Additionally, the base 21 is configured to move the first link 22 in the up and down direction. One end of the second link 23 is rotatably attached to the other end of the first link 22 such that the rotational axis is the up and down direction. The base end of the end effector 24 is rotatably attached to the other end of the second link 23 such that the rotational axis is the up and down direction. At the distal end of the end effector 24, multiple holders for holding the wafers W are provided. An actuator that drives the lift of the first link 22, the joint between the base 21 and the first link 22, the joint between the first link 22 and the second link 23, and the joint between the second link 23 and the end effector 24 is controlled by the controller 100.

The end effector 24 is formed in a fork shape having branches on a distal side and has a base end 240 and two blades 241 and 242 (branches of the fork shape) extending from the base end 240. The blades 241 and 242 extend in the same direction from the base end 240 and are formed at the same height. The blade 241 has holders 243 and 244 that hold multiple wafers W along the longitudinal direction of the blade 241. The blade 242 has holders 245 and 246 that hold multiple wafers W along the longitudinal direction of the blade 242. As described, the four wafers W held by the end effector 24 are held at the same height (on the same plane).

Additionally, sensors S0 to S7 that detect the wafers W are provided inside the transfer module VTM. The sensor S0 detects whether the wafer W is held by the holders 243 to 246 in a state in which the end effector 24 of the transfer device ARM1 is positioned at a reference position (see FIG. 2). The sensor S1 detects whether the wafer W is held and detects the eccentricity amount of the held wafer W when the transfer device ARM1 transfers the wafer W into the process module PM1 or when the transfer device ARM1 transfers the wafer W from the process module PM1. Here, the detection method of the sensor S1 will be described later with reference to FIGS. 3A to 3D. Similarly, the sensors S2 to S6 each detect whether the wafer W is held and the eccentricity amount of the held wafer W when the transfer device ARM1 transfers the wafer W into the process modules PM2 to PM6 or the transfer device ARM1 transfers the wafer from the process modules PM2 to PM6. The sensor S7 detects whether the wafer W is held and detects the eccentricity amount of the held wafer W when the transfer device ARM1 transfers the wafer W into the load-lock module LLM or when the transfer device ARM1 transfers the wafer W from the load-lock module LLM. An optical passing sensor can be used for the sensors S0 to S7, for example. The values detected by the sensors S0 to S7 are input to the controller 100.

The load-lock module LLM is provided between the transfer module VTM and the loader modules LM1 and LM2. The load-lock module LLM is configured to switch between an ambient air atmosphere and a vacuum atmosphere. The load-lock module LLM and the transfer module VTM in the vacuum atmosphere communicate with each other by opening and closing the gate valve GV7. The load-lock module LLM and the loader module LM1 in the ambient air atmosphere communicate with each other by opening and closing a door valve GV8. The load-lock module LLM and the loader module LM2 in the ambient air atmosphere communicate with each other by opening and closing a door valve GV9. The load-lock module LLM includes stages 31 to 34 where a total of four wafers W are mounted in a 2×2 matrix shape in plan view. Additionally, the arrangement of the stages 11 to 14 of the process modules PM1 to PM6 and the arrangement of the stages 31 to 34 of the load-lock module LLM are the same. Here, the switching between the vacuum atmosphere and the ambient air atmosphere in the load-lock module LLM is controlled by the controller 100.

The loader modules LM1 and LM2 have the ambient air atmosphere in which, for example, a clean air downflow is formed. Additionally, a transfer device ARM2 that transfers the wafer W is provided inside the loader module LM1. The transfer device ARM2 carries in and carries out the wafer W between the load-lock module LLM and the loader module LM1 in accordance with the opening and closing of the door valve GV8. Similarly, a transfer device ARM3 that transfers the wafer W is provided inside the loader module LM2. The transfer device ARM3 carries in and carries out the wafer W between the load-lock module LLM and the loader module LM2 in accordance with the opening and closing of the door valve GV9. Additionally, a delivery section (not illustrated) where the wafer W is mounted is provided on the lower side of the load-lock module LLM. The transfer devices ARM2 and ARM3 can deliver the wafer W through the delivery section. Here, the operations of the transfer devices ARM2 and ARM3 and the opening and closing of the door valves GV8 and GV9 are controlled by the controller 100.

The transfer device ARM2 is configured as a multi-joint arm including a base 41, a first link 42, a second link 43, and an end effector 44. One end of the first link 42 is rotatably attached to the base 41 such that the rotational axis is the up and down direction. Additionally, the base 41 is configured to move the first link 42 in the up and down direction. One end of the second link 43 is rotatably attached to the other end of the first link 42 such that the rotational axis is the up and down direction. The base end of the end effector 44 is rotatably attached to the other end of the second link 43 such that the rotational axis is the up and down direction. At the distal end of the end effector 44, a holder 441 that holds the wafer W is provided. An actuator that drives the lift of the first link 42, the joint between the base 41 and the first link 42, the joint between the first link 42 and the second link 43, and the joint between the second link 43 and the end effector 44 is controlled by the controller 100. The transfer device ARM3 is configured as a multi-joint arm substantially the same as the transfer device ARM2.

Load ports LP1 and LP2 are provided on the wall of the loader module LM1. Additionally, load ports LP3 and LP4 are provided on the wall of the loader module LM2. A carrier C in which the wafer W is accommodated or an empty carrier C is attached to the load ports LP1 to LP4. For example, a front opening unified pod (FOUP) or the like may be used as the carrier C.

The transfer device ARM2 can hold the wafer W accommodated in the load port LP1 or LP2 with the holder 441 of the transfer device ARM2 and take out the wafer W. Additionally, the transfer device ARM2 can accommodate the wafer W held in the holder 441 in the load port LP1 or LP2. Similarly, the transfer device ARM3 can hold the wafer W accommodated in the load port LP3 or LP4 with the holder of the transfer device ARM3 and take out the wafer W.

Additionally, the transfer device ARM3 can accommodate the wafer W held in the holder in the load port LP3 or LP4.

The controller 100 includes a central processing unit (CPU), a read only memory (ROM), a random access memory (RAM), and a hard disk drive (HDD). A storage area of the controller 100 is not limited to the HDD and the controller 100 may include another storage area such as a solid state drive (SSD). A recipe in which process procedures, process conditions, and transfer conditions are set is stored in the storage area, such as the HDD, the RAM, and the like.

The CPU controls the processing of the wafer W in each process module PM according to the recipe and controls the transfer of the wafer W. The HDD or RAM may store programs for performing the processing of the wafer W and the transfer of the wafer W in each process module PM. The program may be provided in a storage medium or may be provided by an external device through a network.

<Operation of the Substrate Processing System>

Next, an example of an operation of the substrate processing system will be described. Here, as the example of the operation of the substrate processing system, an operation, in which the wafer W accommodated in the carrier C attached to the load port LP1 is processed in the process module PM1 and the wafer W is accommodated in the empty carrier C attached to the load port LP3, will be described. Here, at the start of the operation, the gate valves GV1 to GV7 and the door valves GV8 and GV9 are closed and the inside of the load-lock module LLM is the ambient air atmosphere.

The controller 100 controls the transfer device ARM2 to take out a first wafer W from the carrier C of the load port LP1 and place the first wafer W on the delivery section (not illustrated). Additionally, the controller 100 controls the transfer device ARM2 to take out a second wafer W from the carrier C of the load port LP1 and place the second wafer W on the delivery section (not illustrated).

The controller 100 opens the door valves GV8 and GV9. The controller 100 controls the transfer device ARM3 to take out the first wafer W placed in the delivery section (not illustrated) and mount the first wafer W on the stage 31 of the load-lock module LLM. In addition, the controller 100 controls the transfer device ARM2 to take out a third wafer W from the carrier C of the load port LP1 and mount the third wafer W on the stage 33 of the load-lock module LLM.

Further, the controller 100 controls the transfer device ARM3 to take out the second wafer W placed in the delivery section (not illustrated) and mount the second wafer W on the stage 32 of the load-lock module LLM. In addition, the controller 100 controls the transfer device ARM2 to take out a fourth wafer W from the carrier C of the load port LP1 and mount the fourth wafer W on the stage 34 of the load-lock module LLM. Here, when the controller mounts the wafers W on the stages 31 to 34, the controller 100 controls the transfer devices ARM2 and ARM3 based on corrected teaching positions (i.e., corrected instructed positions) (S104 and S206), which will be described later, to mount the wafers W on the stages 31 to 34. Four wafers W are mounted on the stages 31 to 34 of the load-lock module LLM, and when the transfer devices ARM2 and ARM3 retreat from the load-lock module LLM, the controller 100 closes the door valves GV8 and GV9.

The controller 100 controls an exhaust device (not illustrated) of the load-lock module LLM to exhaust air in the module and switch from the ambient air atmosphere to the vacuum atmosphere in the load-lock module LLM.

The controller 100 controls the transfer device ARM1 to move the end effector 24 to the reference position. The controller 100 checks that the wafer W is not held in the blade 241 or 242 with the sensor S0. The controller 100 opens the gate valve GV7. The controller 100 controls the transfer device ARM1 to insert the blades 241 and 242 of the end effector 24 into the load-lock module LLM to reach the teaching position in the load-lock module LLM that is set in advance. The controller 100 controls the transfer device ARM1 to hold the wafers W mounted on the stages 31 to 34 of the load-lock module LLM and transfer the wafers W to the transfer module VTM. Here, when receiving the wafers W from the stages 31 to 34, the controller 100 controls the transfer device ARM1 based on the teaching position (S101 and S201), which will be described later, and receives the wafers W from the stages 31 to 34. The arrangement of the stages 31 to 34 of the load-lock module LLM is the same as the arrangement of the stages 11 to 14 of the process module PM1. Therefore, the arrangement of the wafers W held in the blades 241 and 242 of the end effector 24 is substantially the same as the arrangement of the stages 11 to 14 of the process module PM1. When the end effector 24 retreats from the load-lock module LLM, the controller 100 closes the gate valve GV7.

The controller 100 opens the gate valve GV1. The controller 100 controls the transfer device ARM1 to insert the blades 241 and 242 of the end effector 24 into the process module PM1 to the teaching position in the process module PM1 that is set in advance and mount the held wafers W on the stages 11 to 14 of the process module PM1. Here, when mounting the wafers W on the stages 11 to 14, the controller 100 controls the transfer device ARM1 based on the teaching position (S102 and S205), which will be described later, to mount the wafers W on the stages 11 to 14. When the end effector 24 retreats from the process module PM1, the controller 100 closes the gate valve GV1.

The controller 100 controls the process module PM1 to perform a desired process on the wafers W.

When the processing of the wafers W is completed, the controller 100 opens the gate valve GV1. The controller 100 controls the transfer device ARM1 to insert the blades 241 and 242 of the end effector 24 into the process module PM1 to the teaching position in the process module PM1 that is set in advance. The controller 100 controls the transfer device ARM1 to hold the wafers W mounted on the stages 11 to 14 of the process module PM1 and transfer the wafers W to the transfer module VTM. When the end effector 24 retreats from the process module PM1, the controller 100 closes the gate valve GV1.

The controller 100 opens the gate valve GV7. The controller 100 controls the transfer device ARM1 to insert the blades 241 and 242 of the end effector 24 into the load-lock module LLM to the teaching position of the load-lock module LLM that is set in advance, and mount the held wafers W on the stages 31 to 34 of the load-lock module LLM. When the end effector 24 retreats from the load-lock module LLM, the controller 100 closes the gate valve GV7.

The controller 100 controls a suction device (not illustrated) of the load-lock module LLM to supply, for example, clean air into the module and switch from the vacuum atmosphere to the ambient air atmosphere in the load-lock module LLM.

The controller 100 opens the door valves GV8 and GV9. The controller 100 controls the transfer device ARM3 to take out the first wafer W mounted on the stage 31 of the load-lock module LLM and accommodate the first wafer W in the carrier C of the load port LP3. In addition, the controller 100 controls the transfer device ARM2 to take out the third wafer W mounted on the stage 33 of the load-lock module LLM and place the third wafer W in the delivery section (not illustrated).

Further, the controller 100 controls the transfer device ARM3 to take out the second wafer W mounted on the stage 32 of the load-lock module LLM and accommodate the second wafer W in the carrier C of the load port LP3. In addition, the controller 100 controls the transfer device ARM2 to take out the fourth wafer W mounted on the stage 34 of the load-lock module LLM and place the fourth wafer W in the delivery section (not illustrated). When four wafers W are taken out from the stages 31 to 34 of the load-lock module LLM and the transfer devices ARM2 and ARM3 retreat from the load-lock module LLM, the controller 100 closes the door valves GV8 and GV9.

The controller 100 controls the transfer device ARM3 to take out the third wafer W from the delivery section (not illustrated) and accommodate the third wafer W in the carrier C of the load port LP3. Additionally, the controller 100 controls the transfer device ARM3 to take out the fourth wafer W from the delivery section (not illustrated) and accommodate the fourth wafer W in the carrier C of the load port LP3.

An example, in which the wafer W is transferred into the process module PM1 and is transferred from the process module PM1, has been described above. However, the wafer W may be similarly transferred into and from the process modules PM2 to PM6. Additionally, the wafer W processed in the process module PM1 may be transferred into the process module PM2, for example, and the wafer W may be further processed in the process module PM2.

<Operation of Mounting the Wafer W in the Process Module PM1>

Next, an example of the operation of mounting the wafers W held by the transfer device ARM1 on the stages 11 to 14 of the process module PM1 will be further described with reference to FIGS. 3A to 3D and FIGS. 4A to 4D. FIGS. 3A to 3D and FIGS. 4A to 4D are perspective views depicting an example of the operation of mounting the wafers W on the stages 11 to 14 of the process module PM1. Here, in FIGS. 3A to 3D and FIGS. 4A to 4D, only the end effector 24, the stages 11 to 14, the sensor S1, and the wafers W are illustrated, and other configurations are not illustrated. Additionally, the following description assumes that a direction in which the end effector 24 is inserted into the process module PM1 is the forward direction, and a direction in which the end effector 24 is removed from the process module PM1 is the backward direction.

Figure 3A:
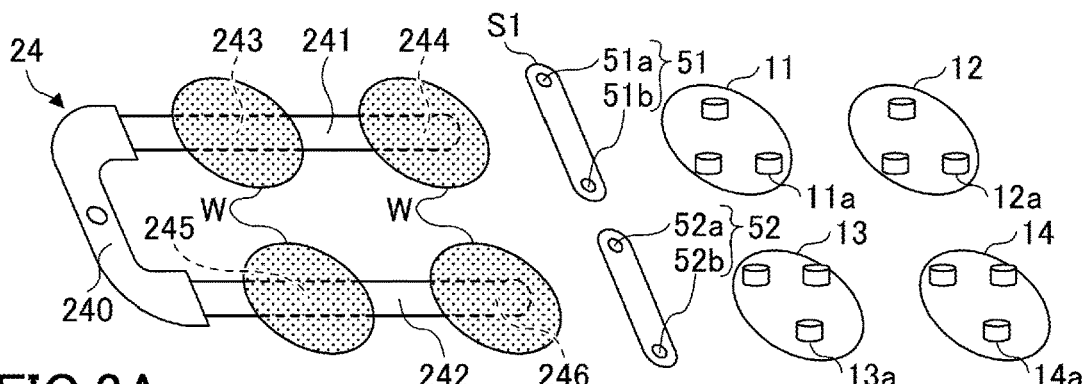
FIG. 3A to FIG. 3D are perspective views depicting an example of an operation of mounting a wafer on a stage of a process module.

As illustrated in FIG. 3A, the controller 100 controls the actuator of each joint of the transfer device ARM1 to move the end effector 24 so that the stages 31 to 34 are positioned in the extending direction of the blades 241 and 242.

Here, the sensor S1 includes sensor units 51 and 52. The number of sensor units is equal to the number of blades of the end effector 24. The sensor unit 51 is disposed on a path in which the blade 241 enters the process module PM1. Additionally, the sensor unit 52 is disposed on a path in which the blade 242 enters the process module PM1.

The sensor unit 51 includes two sensor elements 51a and 51b that are disposed spaced apart. The sensor elements 51a and 51b are, for example, optical passing sensors each including a light emitting unit and a light receiving unit. The sensor elements 51a and 51b detect whether there is an object to be detected by irradiating light from the light emitting unit and detecting reflected light from the object to be detected at the light receiving unit. The space between the sensor element 51a and the sensor element 51b is wider than the width of the blade 241 and narrower than the diameter of the wafer W. Similarly, the sensor unit 52 also includes two sensor elements 52a and 52b.

Figure 3B:
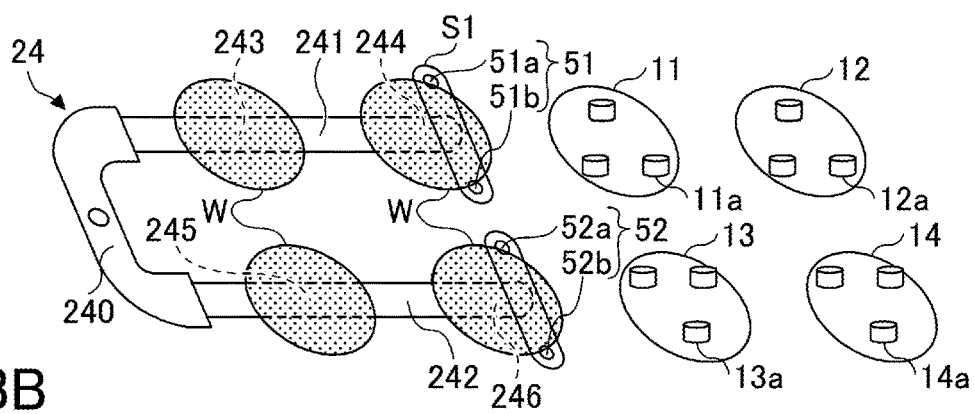

As illustrated in FIG. 3B, the controller 100 controls the actuator of each joint of the transfer device ARM1 to move forward the end effector 24. At this time, the blade 241 passes between the sensor element 51a and the sensor element 51b in top view. When the holder 244 of the blade 241 positions over the sensor unit 51, the sensor elements 51a and 51b of the sensor unit 51 detect the wafer W, so that the controller 100 can determine whether there is the wafer W in the holder 244 based on the value detected by the sensor unit 51. Similarly, when the holder 246 positions over the sensor unit 52, the sensor elements 52a and 52b of the sensor unit 52 detect the wafer W, so that the controller 100 can determine whether there is a wafer W in the holder 246 based on the value detected by the sensor unit 52.

Additionally, the controller 100 acquires a position at which the end effector 24 is situated when the sensor element 51a starts detecting the wafer W, a position at which the end effector 24 is situated when the sensor element 51a stops detecting the wafer W, a position at which the end effector 24 is situated when the sensor element 51b starts detecting the wafer W, and a position at which the end effector 24 is situated when the sensor element 51b stops detecting the wafer W. The controller 100 can detect a position of the wafer W held in the holder 244 based on position information about these four positions. The controller 100 can detect the shift between the reference point of the holder 244 and the center of the wafer W held in the holder 244 (the eccentricity amount) based on the value detected by the sensor unit 51. Similarly, the controller 100 can detect the shift between the reference point of the holder 246 and the center of the wafer W held in the holder 246 (the amount of eccentricity) based on the value detected by the sensor unit 52.

Figure 3C:
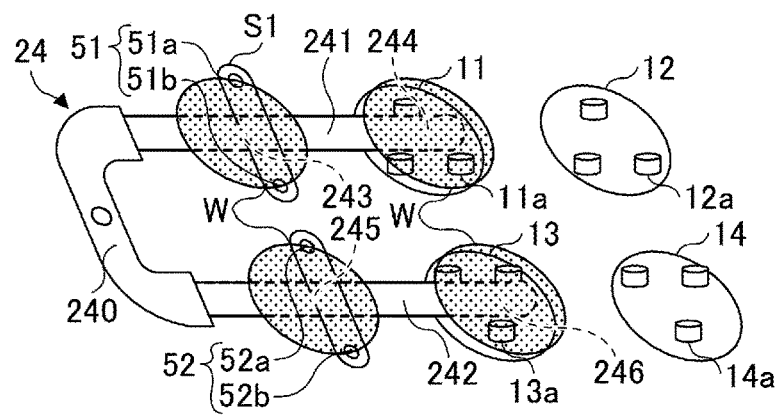

As illustrated in FIG. 3C, the controller 100 controls the actuator of each joint of the transfer device ARM1 to further move forward the end effector 24. At this time, when the holder 243 of the blade 241 positions over the sensor unit 51, the sensor elements 51a and 51b of the sensor unit 51 detect the wafer W, so that the controller 100 can determine whether there is the wafer W in the holder 243 based on the value detected by the sensor unit 51. Similarly, when the holder 245 positions over the sensor unit 52, the sensor elements 52a and 52b of the sensor unit 52 detect the wafer W, so that the controller 100 can determine whether there is the wafer W in the holder 245 based on the value detected by the sensor unit 52.

Additionally, the controller 100 can detect the shift between the reference point of the holder 243 and the center of the wafer W held in the holder 243 (the eccentricity amount) based on the value detected by the sensor unit 51. Similarly, the controller 100 can detect the shift between the reference point of the holder 245 and the center of the wafer W held in the holder 245 (the eccentricity amount) based on the value detected by the sensor unit 52.

Figure 3D:
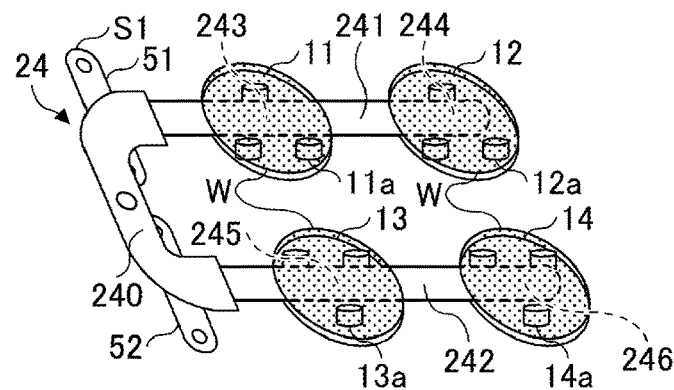

As illustrated in FIG. 3D, the controller 100 controls the actuator of each joint of the transfer device ARM1 to further move forward the end effector 24. Additionally, based on the position shift of the wafer W that is detected by the sensor S1, the movement trajectory to be observed until the operation completion of the transfer device ARM1 is corrected, and the wafer W is transferred. Thus, the wafers W held in the holders 243 to 246 are positioned over the stages 11 to 14.

Figure 4A:
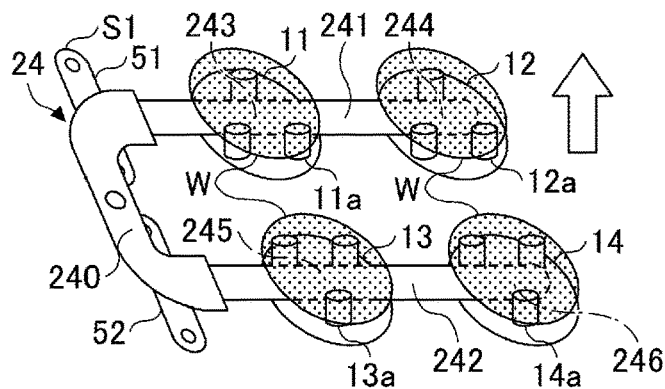
FIG. 4A to FIG. 4D are perspective views depicting an example of the operation of mounting the wafer on the stage of the process module.

Here, the stages 11 to 14 include lift pins 11a to 14a. The lift pins 11a and 12a are disposed at positions different from a position through which the blade 241 passes in top view. Additionally, the lift pins 13a and 14a are disposed at positions different from a position through which the blade 242 passes. Thus, as illustrated in FIG. 4A, when the lift pins 11a to 14a are raised, the lift pins 11a to 14a do not contact the blades 241 and 242 and lift four wafers W held in the end effector 24. Here, four wafers W are held at the same height in the end effector 24 because the heights of the blades 241 and 242 are equal. Thus, the lift pins 11a to 14a may be configured to be raised simultaneously by one lifter.

Figure 4B:
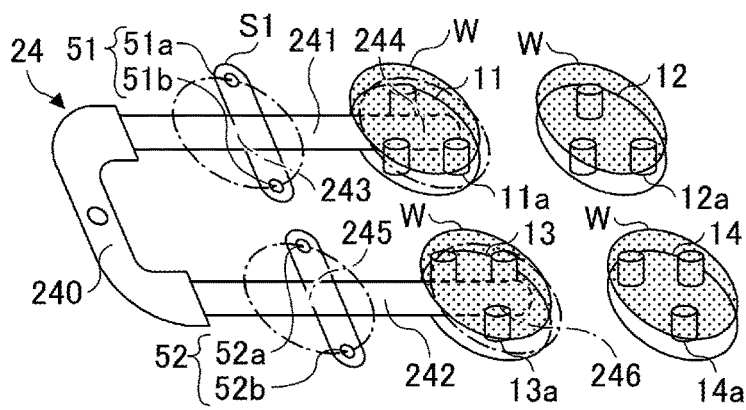

Next, the controller 100 controls the actuator of each joint of the transfer device ARM1 to move backward the end effector 24. Here, as illustrated in FIG. 4B, when the end effector 24 is at the same position as in FIG. 3C, it is checked that the sensor S1 does not detect the wafer W. That is, the controller 100 checks that there are no wafers W in the holders 243 and 245 based on the values detected by the sensor S1. Here, in FIG. 4B and FIG. 4C, the positions where the wafers W were placed are illustrated by dotted lines.

Figure 4C:
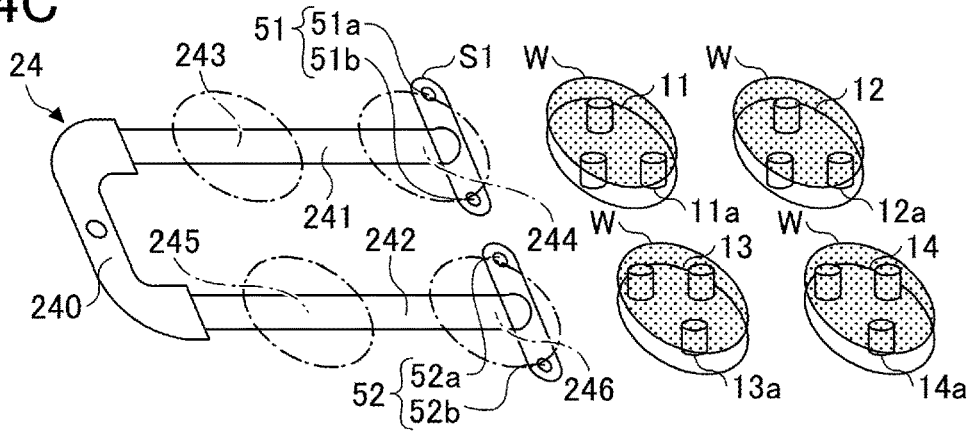

The controller 100 then controls the actuator of each joint of the transfer device ARM1 to further move backward the end effector 24. Here, as illustrated in FIG. 4C, when the end effector 24 is at the same position as in FIG. 3B, it is checked that the sensor S1 does not detect the wafer W. That is, the controller 100 checks that there are no wafers W in the holders 244 and 246 based on the values detected by the sensor S1.

Figure 4D:
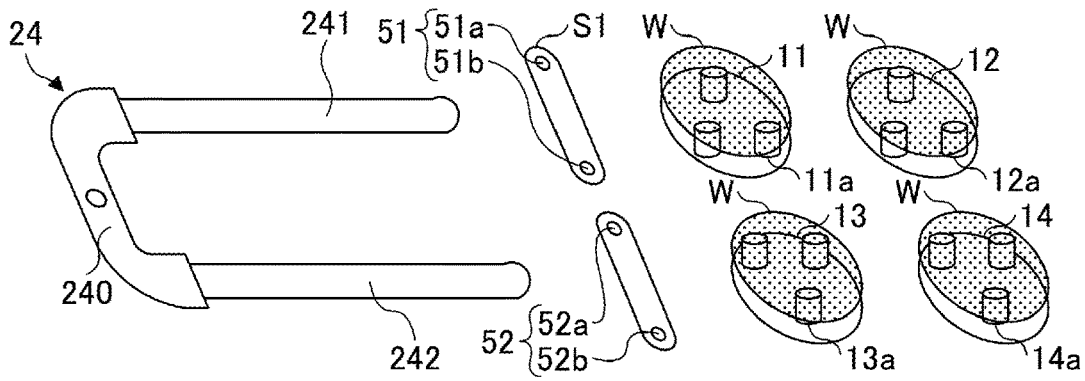

As illustrated in FIG. 4D, by moving backward the end effector 24, the end effector 24 retreats from the process module PM1. Subsequently, the wafers W are mounted on the stages 11 to 14 by lowering the lift pins 11a to 14a.

An example in which the wafer W is transferred into the process module PM1 has been described above. However, when the wafer W is transferred from the process module PM1, it is only required that the steps illustrated in FIGS. 3A to 4D are reversed, and the description thereof is omitted. Additionally, the same will apply when the wafer W is transferred into the process modules PM2 to PM6 or the load-lock module LLM, and the overlapping description is omitted.

<Teaching Method>

Next, a method of teaching the transfer devices ARM1 to ARM3 will be described. FIG. 5 is an example of a flowchart depicting a method of teaching the transfer devices ARM1 to ARM3 in a substrate processing system according to a first embodiment. In the present specification, "teaching the transfer device" indicates determining a position of the end effector and instructing the determined position to the transfer device.

In step S101, the controller 100 teaches the transfer devices ARM1 to ARM3 with respect to the load-lock module LLM. That is, the controller 100 determines positions of the end effectors of the transfer devices ARM1 to ARM3 with respect to the load-lock module LLM and instructs the determined positions to the transfer devices ARM1 to ARM3.

Here, the controller 100 teaches the position of the end effector 44 of the transfer device ARM3 when the transfer device ARM3 delivers the wafer W to the stage 31 of the load-lock module LLM or when the transfer device ARM3 receives the wafer W from the stage 31 of the load-lock module LLM. For example, a wafer-shaped inspection device with a camera (not illustrated) is mounted on the end effector 44 and transferred over the stage 31, and the controller 100 teaches a position such that the center of the wafer-shaped inspection device matches with the center of the stage 31.

Similarly, the controller 100 teaches the position of the end effector 44 of the transfer device ARM3 when the transfer device ARM3 delivers the wafer W to the stage 32 of the load-lock module LLM or when the transfer device ARM3 receives the wafer W from the stage 32 of the load-lock module LLM. Additionally, the controller 100 teaches the position of the end effector 44 of the transfer device ARM2 when the transfer device ARM2 delivers the wafer W to the stage 33 of the load-lock module LLM or when the transfer device ARM2 receives the wafer W from the stage 33 of the load-lock module LLM. Additionally, the controller 100 teaches the position of the end effector 44 of the transfer device ARM2 when the transfer device ARM2 delivers the wafer W to the stage 34 of the load-lock module LLM or when the transfer device ARM2 receives the wafer W from the stage 34 of the load-lock module LLM.

Additionally, the controller 100 teaches the position of the end effector 24 of the transfer device ARM1 when the transfer device ARM1 receives the wafer W from the stages 31 to 34 of the load-lock module LLM or when the transfer device ARM1 delivers the wafer W to the stages 31 to 34 of the load-lock module LLM. For example, wafer-shaped inspection devices with cameras (not illustrated) are mounted on the holders 243 to 246 of the end effector 24 and transferred over the stages 31 to 34, and the controller 100 teaches a position such that the centers of the wafer-shaped inspection devices match with or are close to the centers of the stages 31 to 34.

In step S102, the controller 100 teaches the transfer device ARM1 with respect to the process module PM1. That is, the controller 100 determines a position of the end effector 24 of the transfer device ARM1 with respect to the process module PM1 and instructs the determined position to the transfer device ARM1.

Here, the controller 100 teaches the position of the end effector 24 of the transfer device ARM1 when the transfer device ARM1 delivers the wafers W to the stages 11 to 14 of the process module PM1 or when the transfer device ARM1 receives the wafers W from the stages 11 to 14 of the process module PM1. For example, wafer-shaped inspection devices with cameras (not illustrated) are mounted on the holders 243 to 246 of the end effectors 24 and transferred over the stages 11 to 14, and the controller 100 teaches a position such that the centers of the wafer-shaped inspection devices match with or are close to the centers of the stages 11 to 14.

In step S103, the controller 100 measures the shift amounts of the wafers W in the process module PM1 when the wafers W are transferred from the load-lock module LLM to the process module PM1.

Here, the positions of the stages 11 to 14 have individual errors with respect to the design values. Thus, when the wafers W are mounted on the stages 11 to 14, a shift is generated between the center of each of the stages 11 to 14 and the center of the wafer W mounted thereon.

The controller 100 controls the transfer device ARM1 to receive four wafers W from the stages 31 to 34 at the teaching position in the load-lock module LLM that is set in step S101, and measure the shift amount between the center of each of the stages 11 to 14 and the center of the wafer W mounted thereon when four wafers W are delivered to the stages 11 to 14 at the teaching position in the process module PM1 that is set in step S102. For example, wafer-shaped inspection devices with cameras (not illustrated) are mounted on the stages 31 to 34 and transferred to the stages 11 to 14 by the transfer device ARM1, and the shift amount between the center of each of the stages 11 to 14 and the center of the wafer-shaped inspection device mounted thereon is measured.

Here, the method of measuring the shift amounts is not limited thereto. For example, the wafers W are mounted on the stages 11 to 14 such that the centers of the stages 11 to 14 respectively match with the centers of the wafers W. The wafers W are then delivered from the stages 11 to 14 to the holders 243 to 246 of the end effector 24, and four wafers W are delivered over the sensor S1. With this method, by detecting the position of the edge of each of the wafers W and calculating the center position of each of the wafers W, the shift amounts of the respective stages 11 to 14 may be measured.

In step S104, the controller 100 corrects the positions (the teaching positions) at which the transfer device ARM2 or the transfer device ARM3 delivers the wafers W to the stages 31 to 34 of the load-lock module LLM based on the shift amounts measured in step S103.

That is, the position (the teaching position) at which the transfer device ARM3 delivers the wafer W to the stage 31 of the load-lock module LLM is corrected based on the shift amount in the stage 11. Here, the position (the teaching position) at which the wafer W is delivered to the stage 31 is corrected such that the shift amount is reduced or is canceled.

Similarly, the position (the teaching position) at which the transfer device ARM3 delivers the wafer W to the stage 32 of the load-lock module LLM is corrected based on the shift amount in the stage 12. Additionally, the position (the teaching position) at which the transfer device ARM2 delivers the wafer W to the stage 33 of the load-lock module LLM is corrected based on the shift amount in the stage 13. Additionally, the position (the teaching position) at which the transfer device ARM2 delivers the wafer W to the stage 34 of the load-lock module LLM is corrected based on the shift amount in the stage 14.

Then, when the transfer device ARM2 or ARM3 transfers the wafers W from the carrier C to the process module PM1, the wafers W are mounted on the stages 31 to 34 in consideration of the error from the design values in the stages 11 to 14 of the process module PM1, and four wafers W mounted on the stages 31 to 34 are transferred to the stages 11 to 14. This can reduce the error between the center of each of the stages 11 to 14 and the center of the wafer W mounted thereon.

Additionally, the controller 100 stores respective correction values corresponding to the process modules PM1 to PM6. The controller 100 controls the transfer devices ARM2 or ARM3 to mount the wafers W to the stages 31 to 34 at positions corrected with correction values corresponding to the process modules PM1 to PM6 to which the wafers W are to be transferred. This allows the wafers W to be mounted in accordance with the shift amounts of the stages 11 to 14 in the process modules PM1 to PM6.

Next, another teaching method of the transfer devices ARM1 to ARM3 will be described. FIG. 6 is an example of a flowchart illustrating a method of teaching the transfer devices ARM1 to ARM3 in a substrate processing system according to a second embodiment.

In step S201, the controller 100 teaches the transfer devices ARM1 to ARM3 with respect to the load-lock module LLM.

In step S202, the controller 100 teaches the transfer device ARM1 with respect to the process module PM1.

In step S203, the controller 100 measures the shift amounts of the wafers W in the process module PM1 when the wafer W is transferred from the load-lock module LLM to the process module PM1.

Here, the processing in steps S201 to S203 is substantially the same as the processing in steps S101 to S103, and the overlapping description is omitted.

In step S204, the controller 100 calculates a common shift component and individual shift components with respect to the four wafers W mounted in the stages 11 to 14, based on the shift amounts measured in step S103.

Figure 7:
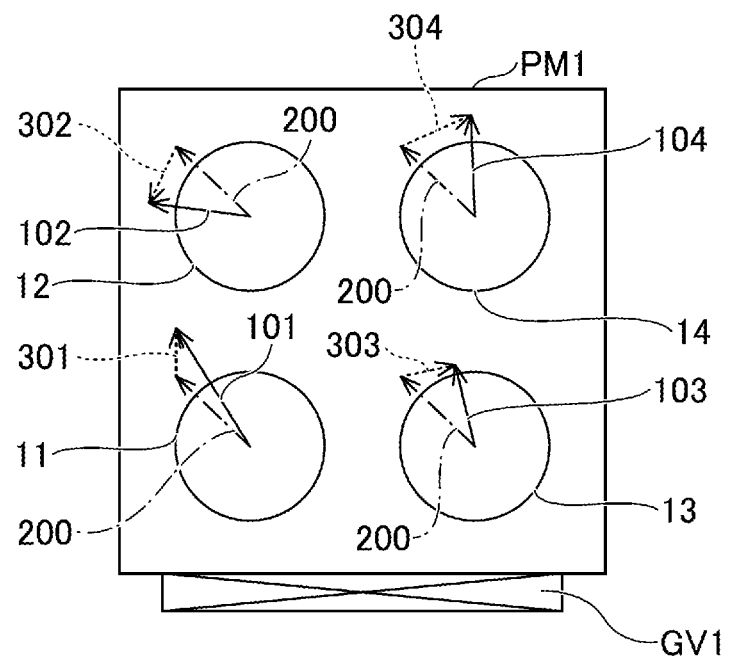
FIG. 7 is an example of a plan view depicting the shift amount in each stage of the process module.

Here, the shift amount of each of the stages 11 to 14 will be described with reference to FIG. 7. FIG. 7 is an example of a plan view depicting the shift amount in each of the stages 11 to 14 of the process module PM1.

An actual shift amount 101 in the stage 11 measured in step S203 is represented by a solid arrow. Similarly, an actual shift amount 102 in the stage 12 is represented by a solid arrow. Additionally, an actual shift amount 103 in the stage 13 is represented by a solid arrow. Additionally, an actual shift amount 104 of the stage 14 is represented by a solid arrow.

Here, the controller 100 calculates a shift component 200 that is common among the shift amounts 101 to 104 and individual shift components 301 to 304 based on the shift amounts 101 to 104 measured in step S203. Here, the sum of the common shift component 200 and the individual shift component 301 is the shift amount 101. The sum of the common shift component 200 and the individual shift component 302 is the shift amount 102. The sum of the common shift component 200 and the individual shift component 303 is the shift amount 103. The sum of the common shift component 200 and the individual shift component 304 is the shift amount 104. The common shift component 200 is represented by a dash-dot-dash arrow. The individual shift components 301 to 304 are represented by dashed arrow.

For example, the controller 100 calculates the common shift component 200 such that the maximum of the individual shift components 301 to 304 is reduced. That is, the common shift component 200 is calculated such that the correction amount in step S206, which will be described later, is reduced.

Here, the method of calculating the common shift component 200 and the individual shift components 301 to 304 is not limited thereto.

Returning to FIG. 6, in step S205, the controller 100 corrects the position (the teaching position) at which the transfer device ARM1 delivers the wafers W to the stages 11 to 14 of the process module 1 based on the common shift component 200 calculated in step S204.

That is, the position (the teaching position) at which the transfer device ARM1 delivers the wafers W to the stages 11 to 14 of the process module PM1 is corrected based on the common shift component 200. Here, the delivery position (the teaching position) is corrected to cancel the common shift component 200.

In step S206, the controller 100 corrects the positions (the teaching positions) at which the transfer device ARM2 or the transfer device ARM3 delivers the wafers W to the stages 31 to 34 of the load-lock module LLM based on the individual shift components 301 to 304 calculated in step S204.

That is, the position (the teaching position) at which the transfer device ARM3 delivers the wafer W to the stage 31 of the load-lock module LLM is corrected based on the individual shift component 301 in the stage 11. Here, the position (the teaching position) at which the wafer W is delivered to the stage 31 is corrected to cancel the individual shift component 301.

Similarly, the position (the teaching position) at which the transfer device ARM3 delivers the wafer W to the stage 32 of the load-lock module LLM is corrected based on the individual shift component 302 in the stage 12. Additionally, the position (the teaching position) at which the transfer device ARM2 delivers the wafer W to the stage 33 of the load-lock module LLM is corrected based on the individual shift component 303 in the stage 13. Additionally, the position (the teaching position) at which the transfer device ARM2 delivers the wafer W to the stage 34 of the load-lock module LLM is corrected based on the individual shift component 304 in the stage 14.

Figure 8:
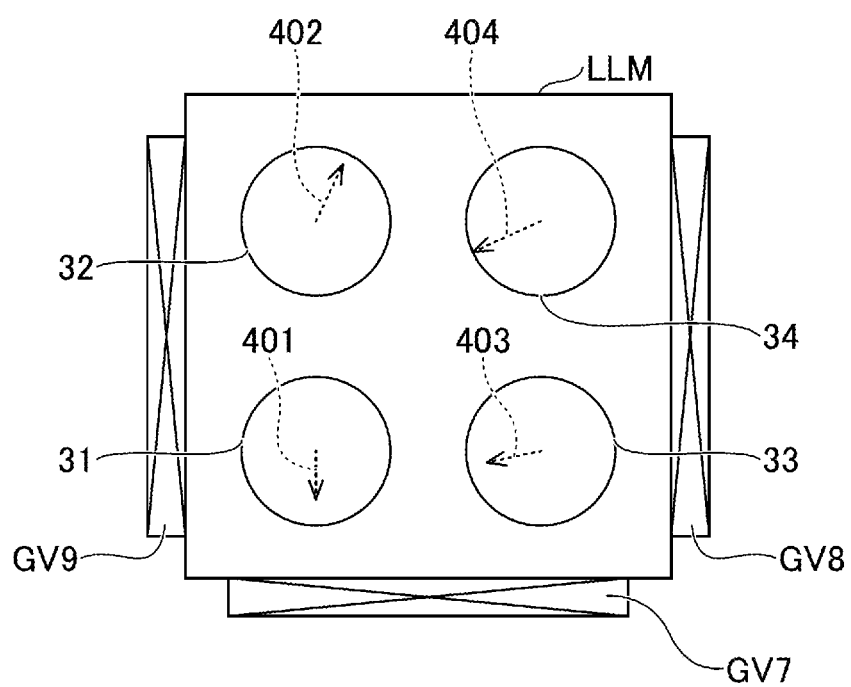
FIG. 8 is an example of a plan view depicting the correction amount in each stage of a load-lock module.

FIG. 8 is an example of a plan view depicting the correction amount in each of the stages 31 to 34 of the load-lock module LLM. A correction amount 401 in the stage 31 is set to cancel the individual shift component 301 illustrated in FIG. 7. For example, the correction amount 401 is directed opposite to the individual shift component 301 and the absolute value of the correction amount 401 is equal to the absolute value of the individual shift component 301.

Similarly, a correction amount 402 in the stage 32 is set to cancel the individual shift component 302 illustrated in FIG. 7. A correction amount 403 in the stage 33 is set to cancel the individual shift component 303 illustrated in FIG. 7. A correction amount 404 in the stage 34 is set to cancel the individual shift component 304 illustrated in FIG. 7.

This allows the wafers W to be mounted on the stages 31 and 34 in consideration of the individual shift components 301 and 304 in the stages 11 and 14 of the process module PM1, when the transfer device ARM2 or ARM3 transfers the wafers W from the carrier C to the process module PM1. When the transfer device ARM1 transfers four wafers W mounted on the stages 31 to 34 to the stages 11 to 14, the wafers W are mounted on the stages 11 to 14 in consideration of the common shift component 200. This can reduce the error between the center of each of the stages 11 to 14 and the center of the wafer W mounted thereon.

Additionally, the controller 100 stores the respective correction values corresponding to the process modules PM1 to PM6. The controller 100 controls the transfer devices ARM2 or ARM3 to mount the wafers W on the stages 31 to 34 at the positions corrected with the correction values corresponding to the process modules PM1 to PM6 to which the wafers W are to be transferred. This allows the wafers W to be mounted in accordance with the shift amounts of the stages 11 to 14 in the process modules PM1 to PM6.

Further, according to the method of teaching the transfer devices ARM1 to ARM3 in the substrate processing system according to the second embodiment, the shift amount can be divided into the common shift amount used by the transfer device ARM1 and the individual shift amounts used by the transfer devices ARM2 and ARM3. This can expand the correction allowable range by dividing a shift amount that is greater than the correction allowable range of the transfer devices ARM1 to ARM3 into the common shift amount used by the transfer device ARM1 and the individual shift amounts used by the transfer devices ARM2 and ARM3. Additionally, because the correction amount of each of the transfer devices ARM1 to ARM3 can be reduced, a high correction accuracy is maintained thereby.

According to one aspect of the present disclosure, a substrate processing system that transfers a substrate in consideration of a shift of a stage and a method of teaching a transfer device can be provided.

Although the substrate processing system has been described above, the present disclosure is not limited to the above-described embodiments and the like, and various modifications and improvements can be made within the scope of the subject matter of the present disclosure as claimed.

What is claimed is:

1. A substrate processing system comprising:
   a load-lock module including a plurality of load-lock module stages;
   a process module including a plurality of process module stages;
   a vacuum transfer module that connects the load-lock module to the process module;
   a first transfer device including a first arm and configured to transfer a plurality of substrates from the plurality of load-lock module stages to the plurality of process module stages, the first transfer device being provided in the vacuum transfer module;
   a second transfer device including a second arm and configured to transfer the plurality of substrates to the plurality of load-lock module stages; and
   a processor configured to perform:
      teaching a position at which the first transfer device receives the plurality of substrates from the load-lock module;
      teaching a position at which the first transfer device delivers the plurality of substrates to the process module;
      measuring shift amounts between the plurality of process module stages and the plurality of substrates mounted on the plurality of process module stages, the shift amounts being measured after the transferring of the first transfer device; and
      correcting positions at which the second transfer device delivers the plurality of substrates to the plurality of load-lock module stages based on the measured shift amounts.

2. A substrate processing system comprising:
   a load-lock module including a plurality of load-lock module stages;
   a process module including a plurality of process module stages;
   a vacuum transfer module that connects the load-lock module to the process module;
   a first transfer device including a first arm and configured to transfer a plurality of substrates from the plurality of load-lock module stages to the plurality of process module stages, the first transfer device being provided in the vacuum transfer module;
   a second transfer device including a second arm and configured to transfer the plurality of substrates to the plurality of load-lock module stages; and
   a processor configured to perform:
      teaching a position at which the first transfer device receives the plurality of substrates from the load-lock module;
      teaching a position at which the first transfer device delivers the plurality of substrates to the process module;
      measuring a first shift amount and a second shift amount between the plurality of process module stages and the plurality of substrates mounted on the plurality of process module stages;

correcting the position at which the first transfer device delivers the plurality of substrates to the process module based on a first shift component; and correcting positions at which the second transfer device delivers the plurality of substrates to the plurality of load-lock module stages based on a second shift component and a third shift component, wherein the measured first shift amount is a sum of the first shift component and the second shift component and the measured second shift amount is a sum of the first shift component and the third shift component.

3. A method of teaching a transfer device in a substrate processing system including a load-lock module including a plurality of load-lock module stages, a process module including a plurality of process module stages, a vacuum transfer module that connects the load-lock module to the process module, a first transfer device including a first arm and configured to transfer a plurality of substrates from the plurality of load-lock module stages to the plurality of process module stages, the first transfer device being provided in the vacuum transfer module, a second transfer device including a second arm and configured to transfer the plurality of substrates to the plurality of load-lock module stages, and a processor, the method comprising:

teaching a position at which the first transfer device receives the plurality of substrates from the load-lock module;

teaching a position at which the first transfer device delivers the plurality of substrates to the process module;

measuring shift amounts between the plurality of process module stages and the plurality of substrates mounted on the plurality of process module stages, the shift amounts being measured after the transferring of the first transfer device; and correcting load-lock module positions at which the second transfer device delivers the plurality of substrates to the plurality of load-lock module stages based on the measured shift amounts.

4. The method as claimed in claim 3, wherein the correcting of the load-lock module positions includes correcting a position in each of the plurality of load-lock module stages based on an amount of the shift amounts in a corresponding stage among the plurality of process module stages.

5. The method as claimed in claim 3, further comprising correcting a process module position at which the first transfer device delivers the plurality of substrates to the process module, wherein the measured shift amounts include a first shift amount and a second shift amount, wherein the correcting of the process module position includes correcting based on a first shift component, wherein the correcting of the load-lock module positions includes correcting positions in the plurality of load-lock module stages based on a second shift component and a third shift component, and wherein the first shift amount is a sum of the first shift component and the second shift component and the second shift amount is a sum of the first shift component and the third shift component.

\* \* \* \* \*